United States Patent [19]
John et al.

[11] Patent Number: 6,097,582
[45] Date of Patent: Aug. 1, 2000

[54] SHORT CIRCUIT PROTECTION OF IGBTS AND OTHER POWER SWITCHING DEVICES

[75] Inventors: Vinod John, Madison, Wis.; Bum-Seok Suh, Seoul, Rep. of Korea; Thomas Anthony Lipo, Middleton, Wis.

[73] Assignee: Wisconsin Alumni Research Foundation, Madison, Wis.

[21] Appl. No.: 09/250,472

[22] Filed: Feb. 12, 1999

[51] Int. Cl.[7] .................................................. H02H 3/18
[52] U.S. Cl. ........................ 361/79; 361/91.6; 361/93.1
[58] Field of Search ................................ 361/79, 86, 87, 361/91.1, 91.5, 91.6, 93.1

[56] References Cited

U.S. PATENT DOCUMENTS 5,500,616  3/1996  Ochi ......................................... 327/310

OTHER PUBLICATIONS

Sven Konrad, "New Driver Stage for Voltage–Controlled Components with Integrated Short–Circuit Protection," EPE Journal, vol. 4, No. 3, Sep., 1994, pp. 9–13.

Rahul Chokhawala, et al., "Switching Voltage Transient Protection Schemes for High Current IGBT Modules," IEEE–APEC Conf. Rec., May 1994, pp. 459–468.

Rahul Chokhawala, et al., "IGBT Fault Current Limiting Circuit," IEEE–IAS Conf. Proceedings, Oct., 1993, pp.1339–1345.

G. Majumdar, "A New Generation of Intelligent Power Devices for Motor Drive Applications," IEE Power Electronics and Variable Speed Drives, 26–28 Oct. 1994, pp. 35–41.

H.–G. Eckel, et al., "Optimization of the Short–Circuit Behaviour of NPT–IGBT by the Gate Drive," EPE Conf. Rec., 1995, vol. 2, pp. 213–218. (No Month).

Primary Examiner—Michael J. Sherry
Attorney, Agent, or Firm—Foley & Lardner

[57] ABSTRACT

A short circuit protection circuit for IGBTs and similar power switch devices. Device collector voltage, e.g., desaturation voltage, is monitored to detect rapidly the occurrence of a short circuit fault. The voltage between the power device emitter and the Kelvin emitter terminals of the device preferably is also monitored and integrated to obtain an estimate of the current flowing through the power switch device. Circuit protection is implemented if either the measured collector to emitter voltage exceeds a selected level or the estimated current through the device exceeds a selected level. Upon the detection of the fault, a capacitor in parallel with a zener diode is connected between the power switch gate and ground. Thus, following a fault, the gate voltage is driven quickly to a low level as the voltage on the gate is discharged through the capacitor. The zener diode establishes a clamp voltage at a selected level of gate voltage that permits controlled current flow through the power switching device that is within the capacity of the device so that the device is not damaged. A pre-charged capacitor is then connected between the gate and ground to turn off the power switching device gradually as the pre-charged capacitor discharges into the gate. The voltage level on the pre-charged capacitor is established by a zener diode connected in parallel thereto.

19 Claims, 12 Drawing Sheets

SHORT CIRCUIT PROTECTION OF IGBTS AND OTHER POWER SWITCHING DEVICES

This invention was made with United States government support awarded by the following agency: NSF Grant No. 9510115. The United States has certain rights in this invention.

FIELD OF THE INVENTION

This invention pertains generally to the field of power electronics and particularly to circuits and methods for protecting semiconductor power switching devices under fault conditions.

BACKGROUND OF THE INVENTION

Short circuit and over-current conditions can result in failure of power devices such as IGBTs (insulated gate bipolar transistors) and other high power semiconductor switching devices (e.g., MOSFETs, etc.) if appropriate remedial action is not taken within a short period of time, generally on the order of a few microseconds. The IGBT short circuit internal failure mechanism is different than the failure mechanism in hard switching inductive turn-off failures. A short circuit condition and the consequent high current through the device results in local heating close to the gate oxide in the IGBT and can severely degrade the device. Excessive power dissipation during the fault leads to chip heating, which can eventually destroy the device. Intelligent power modules and advanced gate driver chips have been developed for protection of IGBTs. However, there are no benchmarks for the performance of these circuits.

Several approaches to the protection of IGBTs have been proposed and studied. These techniques include the use of a capacitor to reduce the gate voltage after the fault. R. Chokawala, et al. "IGBT Fault Current Limiting Circuit," IEEE-IAS Conf. Rec., 1993, pp. 1339–1345. This approach has the limitation that the IGBT current may be shut-off and then turned back on again depending on the initial charge condition of the capacitor and the value of its capacitance. In addition, the capacitor must have a relatively large capacitance value to prevent the capacitor voltage from drifting back to the normal on-state gate voltage. Multiple stages of clamping have also been proposed to increase the endurance time and to reduce the turn-off current level. A pure zener based clamp can be used but has the drawback that the clamping gate voltage can be much larger than desired under the transient conditions of the fault. A protection circuit topology has been proposed wherein the zener and capacitive method is used to limit fault currents. R. Chokawala, et al., "Switching Voltage Transient Protection Schemes for High Current IGBT Modules," IEEE-APEC Conf. Rec. 1994, pp. 459–468. This type of circuit is effective in eventually clamping the fault current level, but it does not limit the large peak current that flows immediately after the fault due to the delay in the operation of the circuit.

In addition to the control of the gate voltage after detection of a fault to limit the current flowing through it, methods have been proposed to softly turn off the IGBT after the fault and to reduce the over-voltage that is due to the turn-off di/dt. See, e.g., H. G. Eckel, et al., "Optimization of Short Circuit Behavior of NPT IGBT by Gate Drive," EPE Conf. Rec., 1995, Vol. 2, pp. 213–218. The purpose of such circuits is to control the over-voltage on the device caused by the parasitic inductance of the power circuit while the device is turning off large currents.

Several problems remain unresolved in the active protection of IGBT modules from fault currents. One such problem is that the use of a large on-state gate voltage to reduce conduction losses through the device makes the fault situation more problematic and dangerous, because it leads to very high fault current, large, instantaneous power dissipation, and the possibility of latching in the device. Thus, a trade-off has been required between the conduction loss during normal operation of the IGBT and the short circuit current magnitude during a fault condition.

Another problem with prior approaches is that the precise detection of fault current levels is difficult if current sensors are not used in series with the IGBTs. In particular, in the case of a large fault inductance (a "soft fault") it is difficult to precisely recognize the over-current conditions using the desaturation technique, which is a common method for identifying a fault situation. This difficulty is due to the reduced voltage drop in the IGBT under low di/dt conditions, as well as the slow dynamics in the electronic components of the detection circuit.

A further complication is that the initial value of the short circuit current is the highest due to the increase gate voltage caused by the Miller capacitance. It is thus not easy to reduce the initial peak current because activation of the protection circuit should be prevented during the normal turn-off transient conditions of the IGBT as well as during the presence of noise phenomena caused by the normal switching of the IGBTs in a power converter circuit.

In addition to a fast, reliable and safe detection of short circuit conditions, after the short circuit condition has been detected and the IGBT is to be shutdown the falling rate of the IGBT current should be controlled to reduce the over-voltage stress on the device. The over-voltage level across the device can become much larger than the rated voltage if the large collector current is turned off without any treatment, particularly with highly inductive loads. In addition, such soft turn-off techniques should take into account possible changes in the operating modes of the protection circuit.

SUMMARY OF THE INVENTION

The present invention provides a short circuit fault protection circuit for power switches such as IGBTs and other power switching devices. The protection circuit in accordance with the present invention provides for fast detection of the occurrence of a fault, limiting of the initial peak current, clamping of the over-current, and safe shutdown of the device.

The protection circuit of the present invention for use with IGBT switching devices preferably utilizes two measures of the current through the device, one based on the collector to emitter voltage, which is a function of the collector current in the device, and the other based on the voltage drop between the power emitter terminal and the Kelvin emitter terminal of the device. By monitoring and integrating the voltage in the connection inductance between the external power emitter terminal and the Kelvin emitter terminal, it is possible to estimate the current flowing through the power switching device. Collector-emitter voltage is preferably monitored using a desaturation voltage detector. In accordance with the present invention, a short-circuit fault is detected and protection implemented if either the measured collector to emitter voltage exceeds a selected level or the estimated current through the device exceeds a selected level. The desaturation voltage detection allows a rapid response to low impedance (hard fault) full under load conditions. The device current estimation is more effective in detecting soft fault situations.

The control of the current through the device after a fault condition is detected is obtained utilizing a limiting circuit composed of a parallel capacitor and zener diode. This combination is preferably connected by a transistor switch between the power switch gate and ground. The transistor switch is turned on when a fault condition is detected. When the transistor switch is turned on, the gate voltage drops initially to a low level (determined by the pre-charge level of the capacitor) and then rises as the capacitor is charged up to the voltage level of the zener diode. The final value of the gate voltage is clamped by the zener diode to the break-over voltage of the zener diode and this clamped gate voltage determines the clamped level of fault current through the device. The value of the zener voltage is selected to be above the threshold voltage for the turn-on of the device and at a level such that the current flow through the power switch device is well within the capacity of the device so that the device is not damaged by the current flow.

It is preferred in accordance with the invention that after the clamped gate voltage level is reached, and the controlled level of fault current is established through the power switch device, the device be turned off in a controlled or soft fashion. To accomplish this, a parallel capacitor and zener diode are connected in series with a transistor switch between the power switch device gate line and ground. The capacitor is pre-charged to a selected voltage level determined by the zener diode. When the clamped value of the power switch gate voltage has been reached and maintained for a sufficient period of time, a signal is provided to the transistor switch to turn on the switch to apply the voltage from the capacitor through the switch, preferably at or near the time that the gate driver turns off the gate drive signal on the gate line. The power switch device is thus gradually turned off as the capacitor gradually discharges.

Further objects, features, and advantages of the invention will be parent from the following detailed description when taken in conjunction with the accompanying drawings.

DETAILED DESCRIPTION OF THE INVENTION

The protection circuit of the present invention provides for fast detection of the occurrence of a fault, limiting of the initial peak current, clamping of the overcurrent, and safe shutdown. The types of short circuit faults that can occur in a power switch such as an IGBT can be classified as hard-switched faults and faults under load. A hard-switched fault occurs when the IGBT tries to turn-on into a short circuit. A fault under load occurs when the IGBT is in the on-state conducting normal load current at the time of the short circuit. The protection circuit of the present invention is capable of detecting and safely handling both types of short circuit faults, while allowing the IGBT to be provided with sufficient gate voltage to drive it to a hard turn-on condition with a low collector to emitter voltage drop and thus low power consumption.

Figure 1:
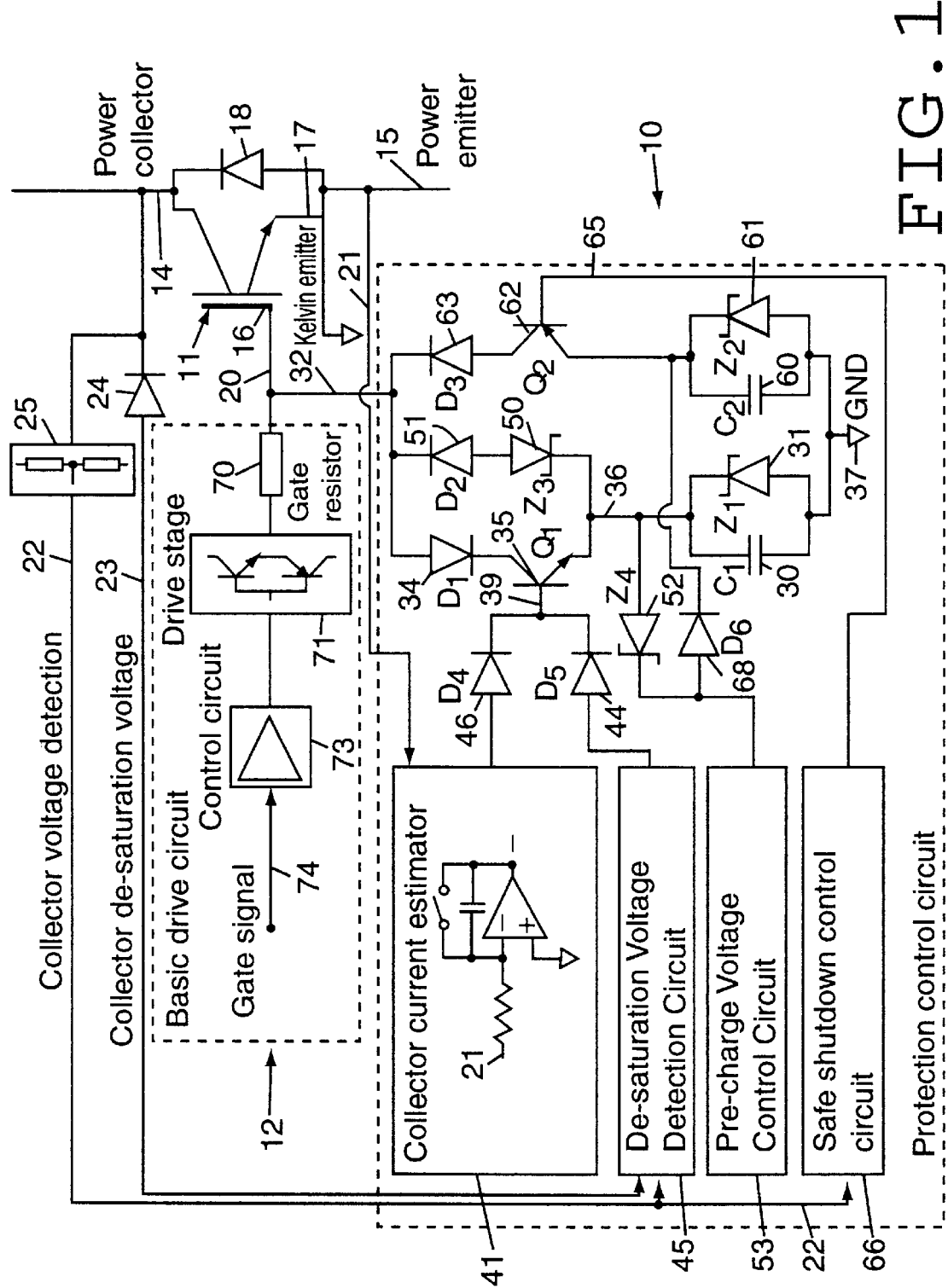
FIG. 1 is a schematic circuit diagram of an IGBT with a gate drive circuit and a short circuit protection circuit in accordance with the present invention connected thereto.

With reference to the drawings, a protection circuit in accordance with the present invention is shown within the block labeled 10 in FIG. 1, along with a power switching IGBT 11 that is to be protected. The basic gate drive circuit for the IGBT is shown generally within the dashed lines labeled 12 in FIG. 1. The IGBT 11 has a power collector terminal 14, a power emitter terminal 15, a gate terminal 16, and a Kelvin emitter terminal 17 which is accessible and connected to a ground line as shown in FIG. 1, with the gate voltage being applied between the gate terminal 16 and the Kelvin emitter terminal 17. A diode 18 is connected across the IGBT. The gate drive circuit 12 provides drive voltage to the gate 16 on a gate input line 20. The protection circuit 10 receives feedback signals on a line 21 connected to the power emitter terminal, on a line 22 connected through a collector voltage detection circuit 25 to detect voltage at the power collector 14, and on a line 23 connected through a diode 24 to the power collector terminal 14. The diode 24 clamps the collector to emitter voltage of the IGBT below the positive gate drive power supply voltage, which is referred to as the collector desaturation voltage, and this desaturation voltage is fed back by the line 23 to the protection circuit.

The protection circuit 10 in accordance with the invention preferably utilizes two measures of the current through the IGBT 11, one based on the collector to the emitter voltage, which is a function of the collector current in the device, and the other based on the voltage drop between the power emitter terminal and the Kelvin emitter terminal of the device. In a conventional IGBT module, the Kelvin emitter terminal 17 is available externally because the gate voltage is applied between the gate and the Kelvin emitter terminal. By monitoring the voltage drop in the connection inductance between the external power emitter terminal 15 and the internal semiconductor Kelvin emitter terminal 17, an estimate can be obtained of the instantaneous collector current. The connection inductance between the terminals 15 and 17 is typically on the order of a few nano-henries, and is larger in the higher power modules due to longer distances between the semiconductor terminal and the power emitter terminal. By integrating this instantaneous voltage, it is possible to estimate the current flowing through the IGBT. In accordance with the present invention, a short-circuit fault is detected and protection implemented if either the measured collector to emitter voltage exceeds a selected level or the estimated current through the device exceeds a selected level. The use of desaturation voltage detection for collector to emitter voltage detection allows a rapid response to low impedance (hard fault) full under load conditions. The device current estimation is more effective in detecting soft fault situations. In addition, direct measurement of the collector voltage, on the feedback line 22, is preferably used to rapidly recognize hard-switched fault conditions and to distinguish such conditions from normal switching transients of the IGBT.

Referring again to FIG. 1, limiting of the current through the device 11 under fault conditions is obtained utilizing a limiting circuit composed of a paralleled capacitor 30 and zener diode 31; this combination is connected, by a line 32 through a diode 34, a transistor switch 35, and a connecting line 36, between the gate input line 20 and ground (indicated at 37). The base of the transistor 35 is connected through a first diode 40 to a collector current estimating circuit 41 that is composed of a resettable integrator that receives the voltage from the power emitter terminal 15 on the line 21 and integrates the voltage between the line 21 and ground. The base 39 of the transistor 35 is also connected through a diode 44 to a desaturation voltage detection circuit 45 which receives the collector voltage detection signal on the line 22 and the collector desaturation voltage signal on the line 23. The diodes 40 and 44 effectively act as an OR gate to supply a first fault signal output from the collector current estimator circuit 41 or a second fault signal output from the desaturation voltage detection circuit 45, when such output signals are high, to the base 39 of the transistor 35. On detection of the fault, the transistor 35 is thus turned on, which causes the capacitor 30 to charge up to the voltage level of the zener diode 31, thus discharging the voltage on the gate line 20 through the capacitor 30. A relatively large value of the capacitance of the capacitor 30 will result in an initial oscillation of the current through the device 11 and a slow ramp up to the clamp current level. On the other hand, a relatively small capacitance value of the capacitor 30 will result in an increased peak fault current due to insufficient gate discharge. A zener diode 50 and a diode 51 are connected in series around the diode 34 and the transistor 35, and a zener diode 52 is connected between the connecting line 36 and a pre-charge voltage control circuit 53. The zener diodes 50 and 52 are utilized to charge the capacitor 30 to a desired pre-charge voltage level before the IGBT is turned off. The pre-charge voltage on the capacitor 30 compensates for the delay in operation of the protection circuit. A lower pre-charge voltage results in faster activation of the protection circuit to more quickly discharge the gate. The on-state voltage of the IGBT 11 and the voltage drop along the desaturation detection circuit limit the maximum value of this pre-charge voltage.

The final value of the gate voltage is clamped by the zener diode 31 to the break-over voltage of this zener and this clamped gate voltage determines the clamped level of fault current through the device 11. The value of the zener voltage is selected to be above the threshold voltage for turn-on of the device 11—that is, a voltage intermediate between the full-on and full-off gate voltages of the device—and the value selected depends on the transconductance gain of the IGBT 11 being protected. The voltage drops across the transistor 35 and the diode 34 should be taken into account when selecting the proper value for the zener diode 31.

The action of the paralleled capacitor 30 and zener diode 31 is, thus, upon detection of a fault and the turn-on of the switch 35, to drive the gate voltage quickly to a low level (essentially to the pre-charge voltage on the capacitor 30) as the voltage on the gate line 20 is discharged through the capacitor 30. As the capacitor 30 charges up, the voltage on the gate line 20 will similarly increase, until the level of the zener diode 31 break-over voltage is reached. The rapid initial discharge of the gate voltage on the line 20 as it charges the capacitor 30 is advantageous because IGBTs are minority carrier devices, and the rapid initial drop in the gate voltage is required to sweep the minority carriers out quickly. The clamp voltage determined by the zener diode 31 is selected to be at a level of gate voltage that permits controlled current flow through the IGBT 11 that is within the capacity of the device so that the device is not damaged by this current flow, at least for a relatively short and controlled period of time.

It is preferred in accordance with the invention that after the clamped gate voltage level is reached, and the controlled fault current is established through the device 11 for a selected period of time, the device be turned off in a controlled or soft fashion. To accomplish this, a paralleled capacitor 60 and zener diode 61 are connected in series with a transistor switch 62 and diode 63 between the line 32 (connected to the gate line 20) and ground 37. The base of the transistor 62 is connected by a line 65 to a safe shutdown control circuit 66 which receives the collector voltage detection signal from the line 22. When the shutdown control circuit 66 determines that the clamped value of the gate voltage on the line 20 has been reached and maintained for a sufficient period of time, it provides an output signal on the line 65 to turn on the switch 62, applying the voltage from the capacitor 60 through the switch 62 and the diode 63 to the gate line 20 and provides a shutdown signal to the system controller (not shown) to cause it to cut off the gate drive signal. The current path changes during shutdown from: (1) the diode 34 through the transistor 35 and the zener 31, which takes place during the clamping mode, to (2) a current path through the capacitor 60, the transistor 62 and the diode 63 during shutdown. The pre-charge level of the capacitor 60 is preferably selected to be at a chosen level higher than the gate voltage level used for clamping, due to the voltage drop in the conducting paths of the shutdown circuit, thus eliminating the small notch in gate voltage caused by reversal of current from the clamping mode to the safe shutdown mode. A diode 68 is connected to the pre-charge circuit 53 and allows the decoupling of the pre-charge voltage levels for the capacitors 30 and 60. The break-over voltage value for the zener diode 61 determines the pre-charge level of the capacitor 60.

The protection circuit 10 can strongly reject nuisance fault signals because the main fault signal sent to the system controller that controls the input to the gate drive 12 is based on the measured voltage between the collector and the emitter. In addition, a delay time of a few microseconds is preferably incorporated in the report of the fault signal to the system controller to allow for the momentary transient in current that can occur without damaging the device. Such momentary transients are also held to the clamping current level. As shown in FIG. 1, the collector voltage on the line 22 can be used to provide a time delayed enable signal (e.g., 3–4 $\mu$sec. delay) to the desaturation detection circuit 45, or the gate turn-on signal from the controller can be time delayed and used to provide an enable signal to the desaturation voltage detection circuit, as described further below.

After activation of the safe shutdown control circuit 66 so that the voltage on the gate line 20 is provided from the capacitor 60, the main system controller provides a shut-off gate control signal to the gate drive circuit 12, with the result that gate voltage on the line 20 decays gradually as the capacitor 60 discharges, thereby gradually reducing the current through the device 11 until it is fully shut off.

Figure 2:
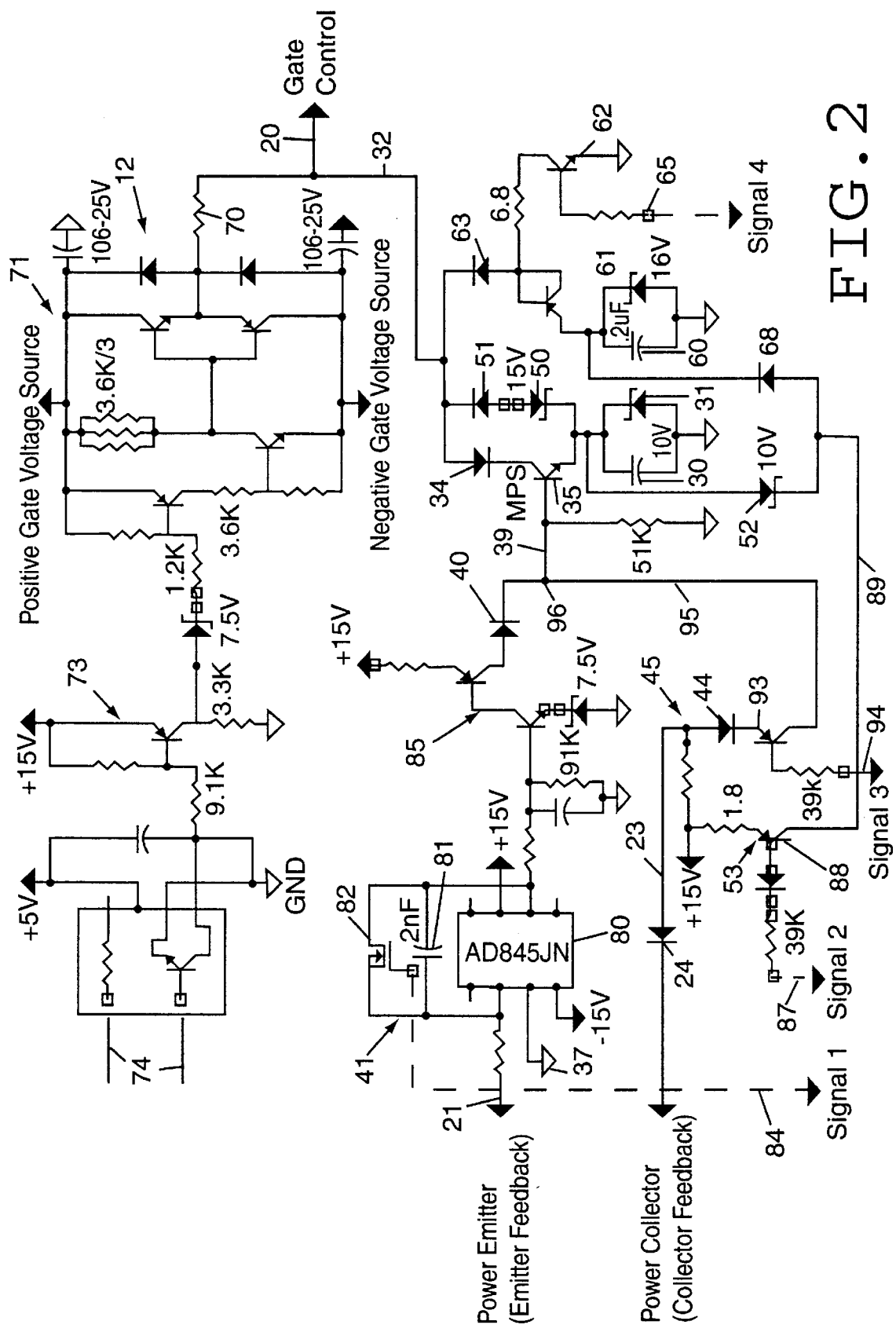
FIG. 2 is a more detailed schematic circuit diagram of a short circuit protection circuit in accordance with the present invention.

As illustrated generally in FIG. 1, and in the more detailed circuit schematic of FIG. 2, the basic gate drive circuit 12, which may be of conventional design, includes a gate resistor 70, a drive stage 71 which provides the high and low drive voltages to the gate through the gate resistor 70, and a control circuit 73 which receives and amplifies the gate input signal on a line 74 from the system controller (not shown). The components of the gate drive are conventional, although it is understood that the protection circuit 10 of the present invention may, if desired, be integrated with the gate drive circuit rather than being provided as a separate circuit.

With reference to the more detailed schematic diagram of FIG. 2, the collector current estimator circuit 41 may be implemented utilizing a conventional IC operational amplifier 80 with a feedback capacitor 81 and with a power switch 82 in parallel with the capacitor 81 which is controlled by a gate signal (SIGNAL 1 in FIG. 2) on a line 84 received from the system controller. The output of the operational amplifier/integrator 80 is provided to a comparator and amplifying section 85, the output of which is provided through the diode 40 to the line 39. The comparator 85 switches to provide a fault signal through the diode 40 when the output of the integrator reaches a selected level indicative of a fault.

The pre-charge control circuit 53 receives an input signal (SIGNAL 2 in FIG. 2) from the system controller on a line 87 to control a transistor switch 88 that is switched to provide the pre-charge voltage on a line 89 through the diodes 52 and 68 to pre-charge the capacitors 30 and 60, respectively.

The desaturation voltage detection circuit 45 receives the power collector desaturation voltage on the line 23 from the power collector. This line is connected through a resistor 91 to a positive supply voltage, and is also connected through the diode 44 to a transistor switch 93 which is gated by a signal (SIGNAL 3 in FIG. 2) from the system controller on a line 94. The output of the transistor 93 is provided on a line 95 to a junction 96 at which it is joined to the line 39.

Figure 3:
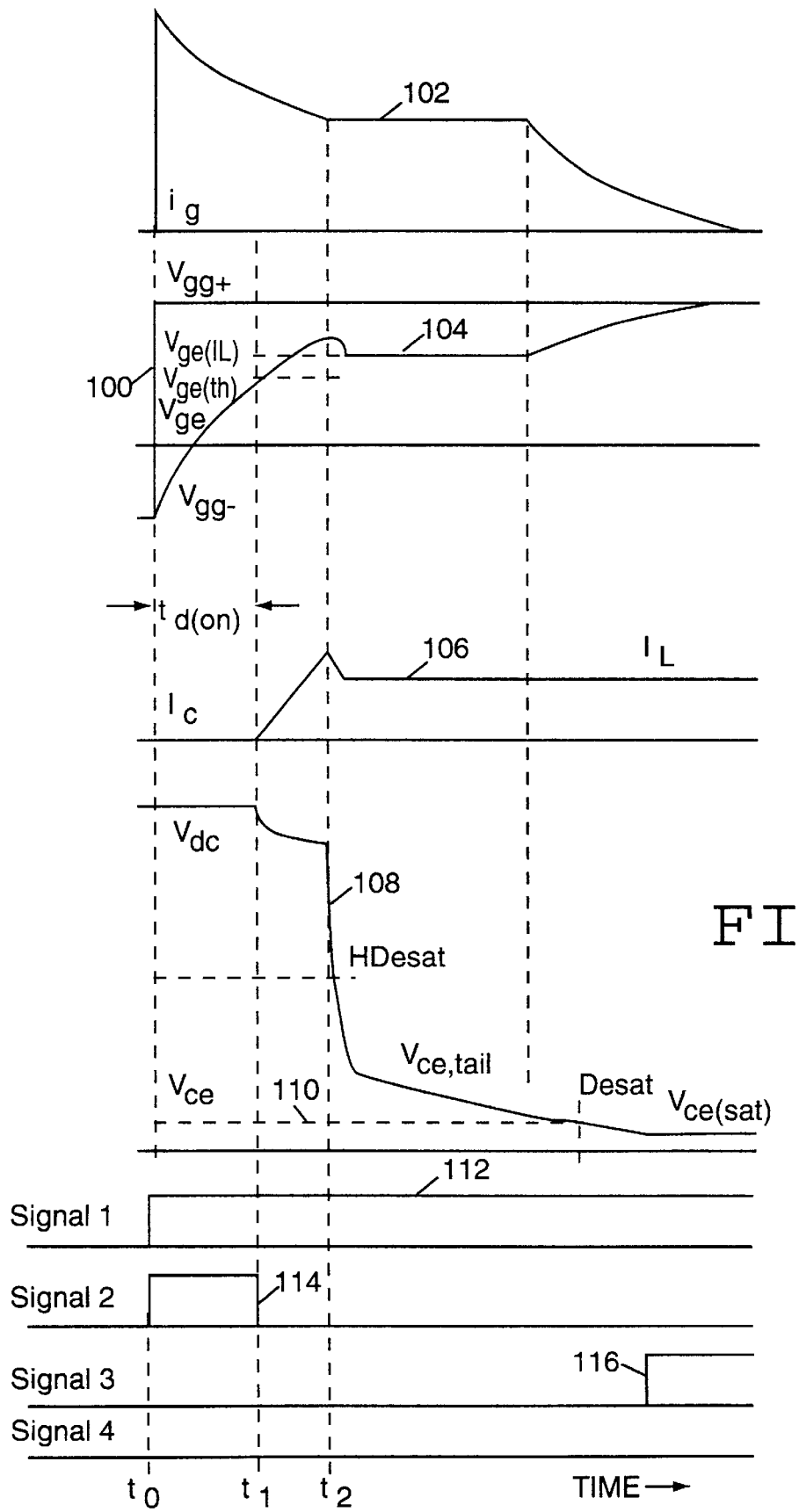
FIG. 3 are diagrams illustrating waveforms during turn-on of a device provided with a short circuit fault protection circuit in accordance with the present invention under normal conditions.
Figure 4:
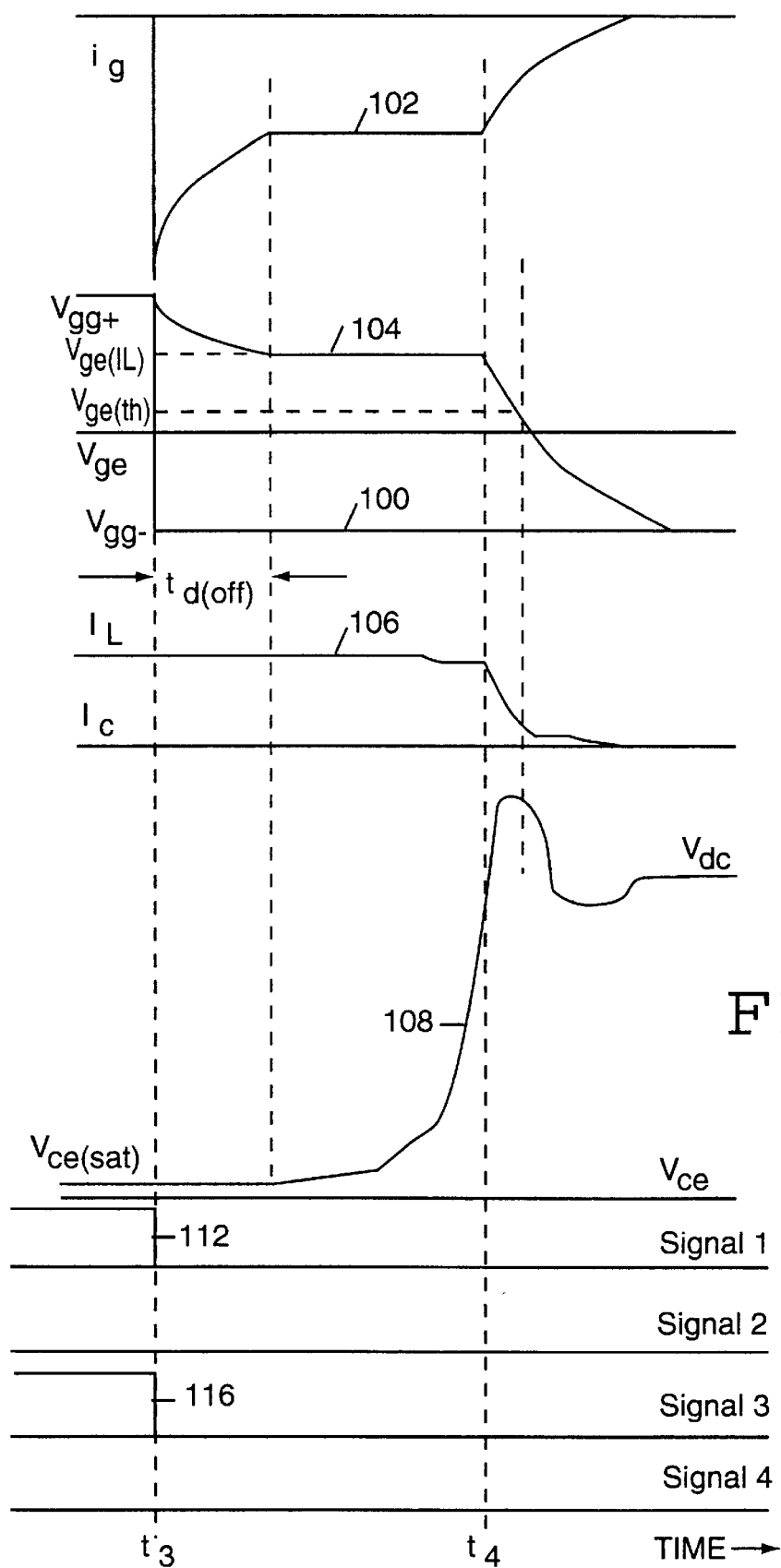
FIG. 4 are diagrams illustrating waveforms during turn-off of a device provided with a short circuit fault protection circuit in accordance with the present invention.
Figure 5:
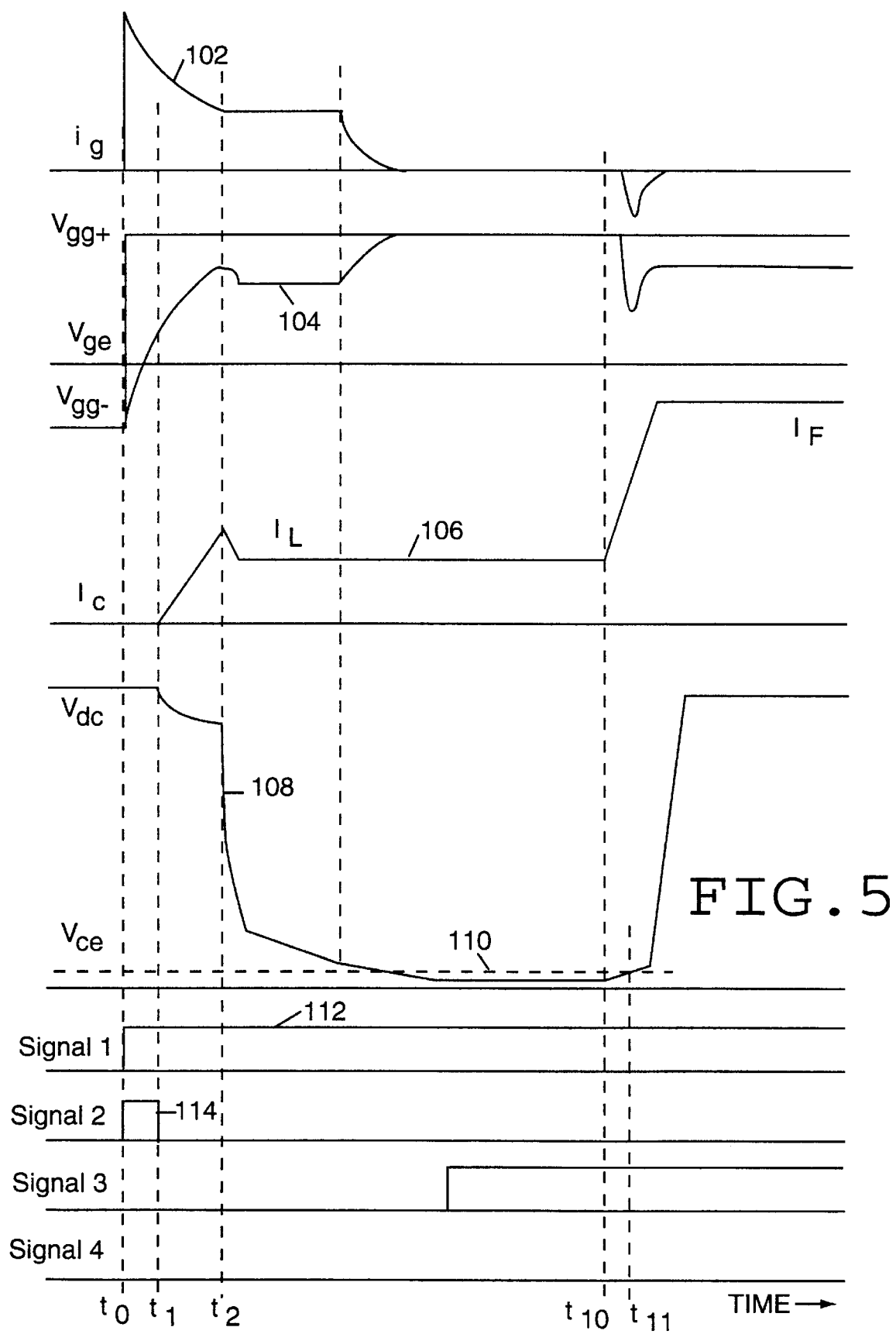
FIG. 5 are diagrams illustrating waveforms for operation of a device provided with the short circuit fault protection circuit in response to a fault underload condition.
Figure 6:
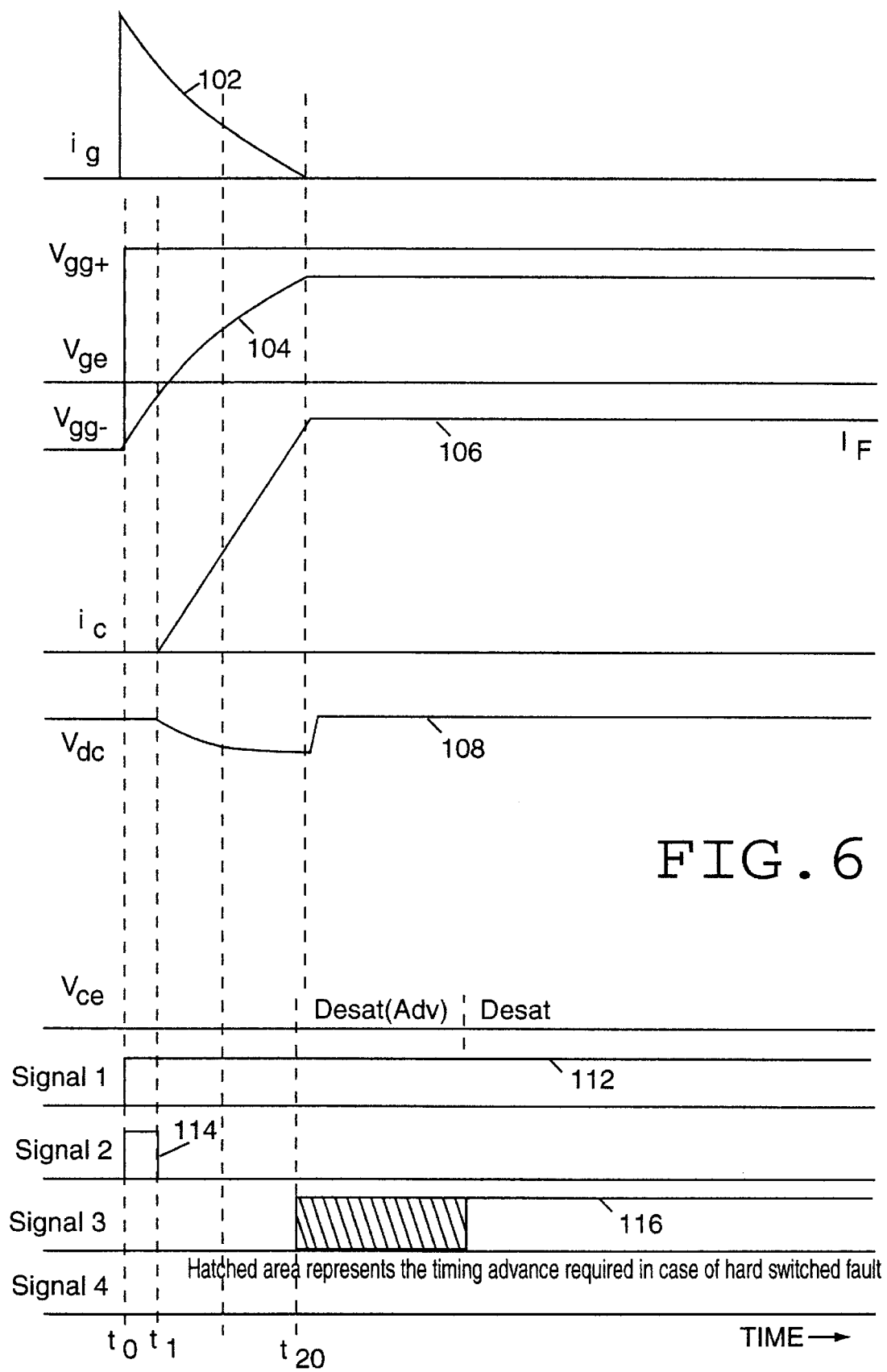
FIG. 6 are diagrams illustrating waveforms for operation of a device provided with the short circuit fault protection circuit in response to a hard-switched fault.
Figure 7:
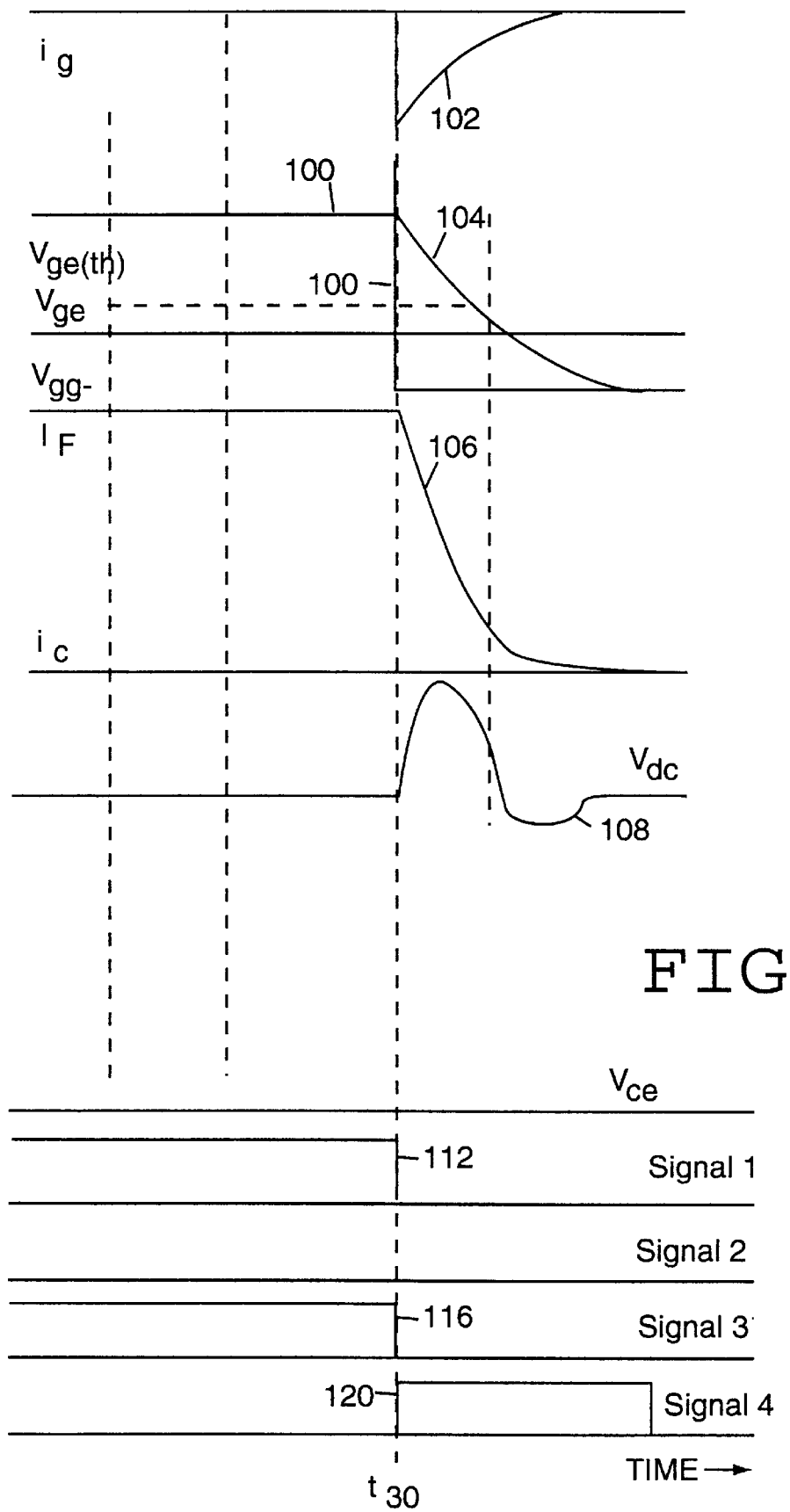
FIG. 7 are diagrams illustrating waveforms for a device provided with the short circuit fault protection circuit during shutdown following the occurrence of a fault condition.

The waveforms in the timing diagrams of FIGS. 3–7 illustrate operation of a device 11 provided with short circuit fault protection by a protection circuit 10 in accordance with the present invention. FIGS. 3 and 4 illustrate turn-on and turn-off of the device 11 under normal conditions. FIG. 5 illustrates operation of the device 11 and protection circuit 10 in response to a fault under load condition. FIG. 6 illustrates operation of the device 11 and protection circuit 10 in response to a hard-switched fault. FIG. 7 illustrates shutdown of the device 11 following the occurrence of either fault condition. For purposes of clarity of illustration, the active levels of SIGNAL 1, SIGNAL 2 and SIGNAL 3 are shown in FIGS. 3–7 as high, and inactive as low, which is inverted from the signals as applied to the circuit of FIG. 2.

As illustrated in FIG. 3, under normal turn-on conditions, a gate turn-on voltage signal 100 is provided to the gate line 20 to turn the device 11 on at time $t_0$. In response to the gate turn-on signal 100, there is a sudden rise in the gate current 102, which is followed by a gradual decline thereof. Simultaneously, the gate to emitter voltage 104 begins to increase gradually in response to the gate turn-on signal 100. At time $t_1$ the device 11 turns on as the collector current 106 begins to rise. Simultaneously, the collector-emitter voltage 108 begins to drop. At time $t_2$ the collector current 106 reaches its peak. Following time $t_2$, the collector current settles into its steady state level, the gate current declines to zero, the gate-emitter voltage 104 reaches a steady state level at the gate input voltage level Vgg+, and the collector-emitter voltage 108 drops to a steady state level below the desaturation voltage threshold level 110. In the protection circuit 10, an active signal value 112 of SIGNAL 1 is provided on the line 84 to turn off the switch 82, to thereby enable the collector current estimator circuit 41, at the time the device turn-on signal 100 is applied. This signal remains active, thereby enabling the collector current estimator 41, throughout normal operation of the device 11. Also simultaneous with the application of the device turn-on signal 100, an active value 114 of SIGNAL 2 is provided on line 87 to activate the pre-charge voltage control circuit to charge the capacitors 30 and 60 to the desired pre-charge voltage level. During the initial start-up period of the device 11, SIGNAL 3 is not active and the desaturation voltage detection circuit 45 is disabled to prevent shutdown of the device 11 during start-up, when the collector-emitter voltage is higher than the desaturation voltage threshold. After a time delay, e.g., 3–4 microseconds, an active value 116 of SIGNAL 3 is provided on the line 94 to enable the desaturation voltage detection circuit. The switching of the value of SIGNAL 3 may be determined by monitoring the collector voltage on the line 22 and timing the signal 116 from a selected level of collector voltage or by a set time delay from the gate signal 100 or a combination of these As illustrated in FIG. 4, under normal conditions, turn-off of the device 11 is initiated by driving the control voltage signal 100 provided to the gate negative (to Vgg–) at a time $t_3$. Simultaneously, the active values 112 and 116 of SIGNAL 1 and SIGNAL 3, provided on lines 84 and 94 to enable the collector current estimator circuit 41 and the desaturation voltage detection circuit 45, respectively, are driven to inactive levels, thereby effectively disabling the protection circuit 10. In response to the change in the gate input voltage signal 100, the gate current 102 rapidly changes from zero to a negative current value and then begins a gradual return to zero. Simultaneously, the gate-emitter voltage 104 begins a gradual decline. At time $t_4$ the device 11 begins to turn off as the gate voltage 104 and the collector current 106 drop rapidly. The rapid drop in the collector current 106 is accompanied by a rapid increase in the collector-emitter voltage 108 to the steady state voltage level, a rapid decrease of the gate current 102 to zero, and a rapid decrease of the gate-emitter voltage 100 to the turn-off voltage level Vgg–.

FIG. 5 illustrates operation of the device 11 protected by a protection circuit 10 in response to a fault under-load condition. In this case, the device 11 is turned on normally, as described with reference to FIG. 3. The SIGNAL 1 high signal 112 is applied on the line 84 to activate the collector current estimator circuit 41, the SIGNAL 2 signal 114 has been applied on line 87 to activate the pre-charge voltage control circuit 53, thereby charging the capacitors 30 and 60 to the desired voltage level, and SIGNAL 3 signal 116 is present on line 94 to enable the desaturation voltage detection circuit 45. Assume that a short circuit fault occurs at time $t_{10}$. This causes the collector current 106 to rise rapidly. Simultaneously, the collector-emitter voltage level 108 also begins to rise. At time $t_{11}$ the collector-emitter voltage exceeds the desaturation voltage threshold level 110. This condition is detected by the desaturation voltage detection circuit 45, which, in response thereto, turns on the switch 35 in the protection circuit 10. This drives the gate voltage 104 quickly to a low level as the voltage on the gate line 20 is discharged through the capacitor 30. As the capacitor 30 charges up, the voltage on the gate line 20 similarly increases, until the level of the zener diode 31 break-over voltage is reached. The gate current 102 reacts similarly, increasing rapidly in a negative direction as the capacitor 30 is charged, and then dropping back to zero when the level of the zener diode 31 break-over voltage is reached. The gate voltage 104 settles at the break-over voltage level of the zener diode 31, which is selected to be at a level of gate voltage that permits controlled level of current flow through the device 11 that is within the capacity of the device, so that the device is not damaged by the current flow. Thus, after time $t_{11}$, the collector current 106 settles at a relatively high, but controlled current level $I_F$.

FIG. 6 illustrates operation of the device 11 protected by a protection circuit 10 under a hard-switched fault condition, wherein the device 11 tries to turn-on into a short circuit. At time $t_0$ the gate turn-on signal 100 is driven high. Simultaneously, active level signals 112 and 114 are provided on the lines 84 and 87, to enable the collector current estimator circuit 41 in the protection circuit 10, and to turn on the pre-charge voltage control circuit 53 to charge the capacitors 30 and 60 to the desired capacitor voltage level, respectively. As under normal conditions, the gate current 102 rises rapidly and then begins to decline in response to the application of the gate input signal 100. Simultaneously, the gate-emitter voltage 104 begins to rise. At time $t_1$ the device 11 begins to turn on as the collector current 106 increases and the collector-emitter voltage level 108 begins to decrease. However, since the device is being turned on into a short circuit, the collector-emitter voltage 108 never drops below the desaturation voltage threshold level. Thus, when the active signal 116 is provided on the line 94 to activate the desaturation voltage detection circuit 45, at time $t_{20}$, a signal is immediately provided by the desaturation voltage detection circuit to turn on the switch 35. This limits the gate-emitter voltage 104 to the break-over voltage level of the zener diode 31. As discussed previously, the clamp voltage determined by the zener diode 31 is selected to be at a level of gate voltage that permits controlled current flow through the device 11 that is within the capacity of the device, so the device is not damaged by the current flow. Thus, the collector current 106 settles at a relatively high but controlled level $I_F$.

FIG. 7 illustrates the shutdown of the device 11 protected by the protection circuit 10 following the occurrence of a hard switched or under-load fault condition as described previously. After the clamped gate voltage level is reached following a fault, and a controlled fault current is established through the device 11, the device is preferably turned off in a controlled or soft fashion. At time $t_{30}$ the protection circuit controller enables a SIGNAL 4 active signal 120 provided on line 65 to turn on the switch 62 in the protection circuit 10. This provides a current path from the gate of the device 11 through the pre-charged capacitor 60. Simultaneously, the controller provides a shutdown signal which causes the gate drive signal 100 to be driven low. The gate-emitter voltage 104 initially stays at the on voltage level Vgg+ because the pre-charge voltage of the capacitor 60 is applied to the gate line and then drops in a controlled fashion as the capacitor 60 discharges. The gate current 102 responds in a similar fashion, increasing rapidly (negatively) initially as the switch 62 is turned on, and then gradually returning to zero. In this manner, the device 11 is turned off in a controlled or soft fashion as the collector current 106 is gradually reduced to zero.

Figure 8:
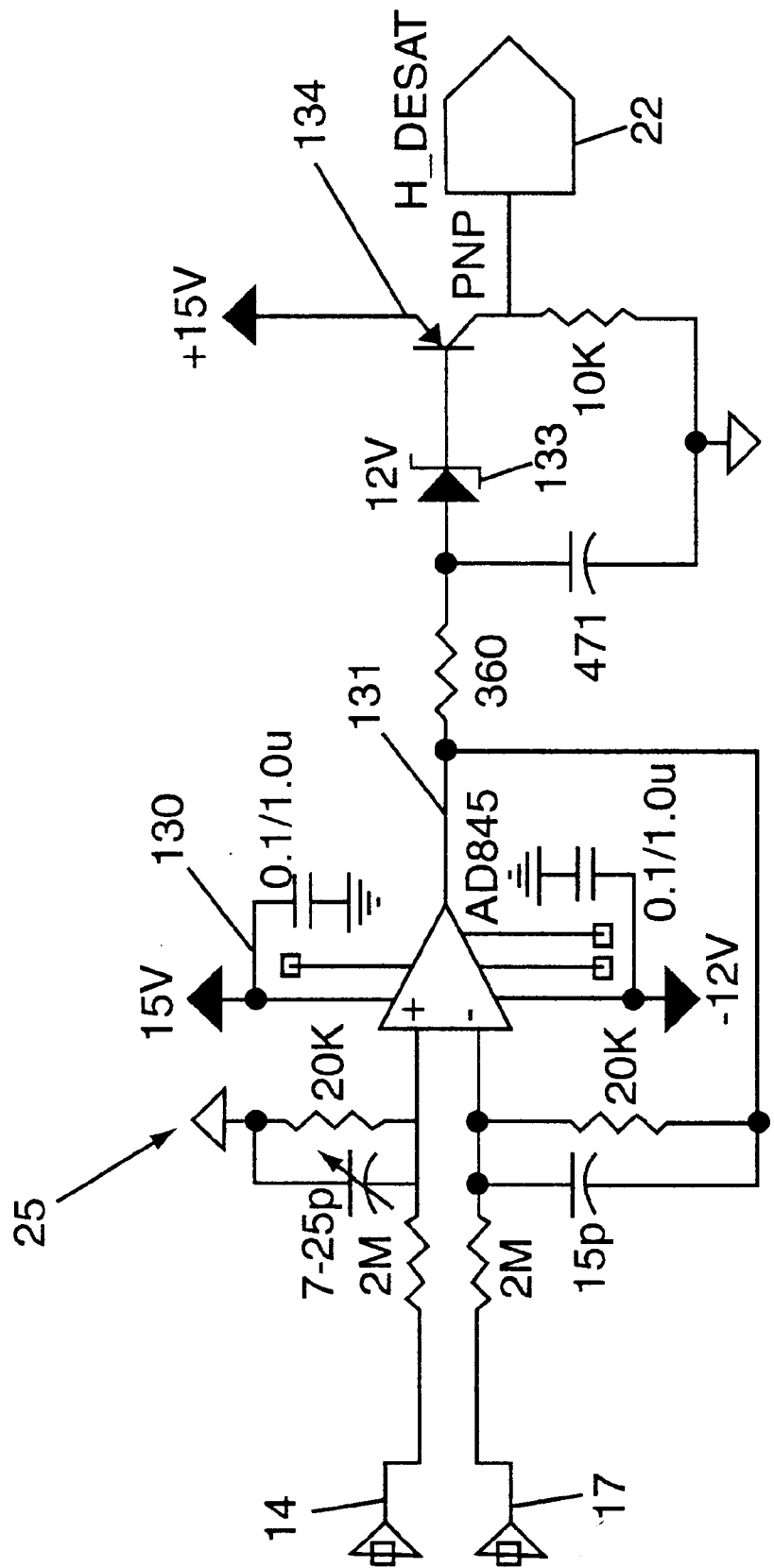
FIG. 8 is a schematic circuit diagram for the collector voltage detection circuit.
Figure 9:
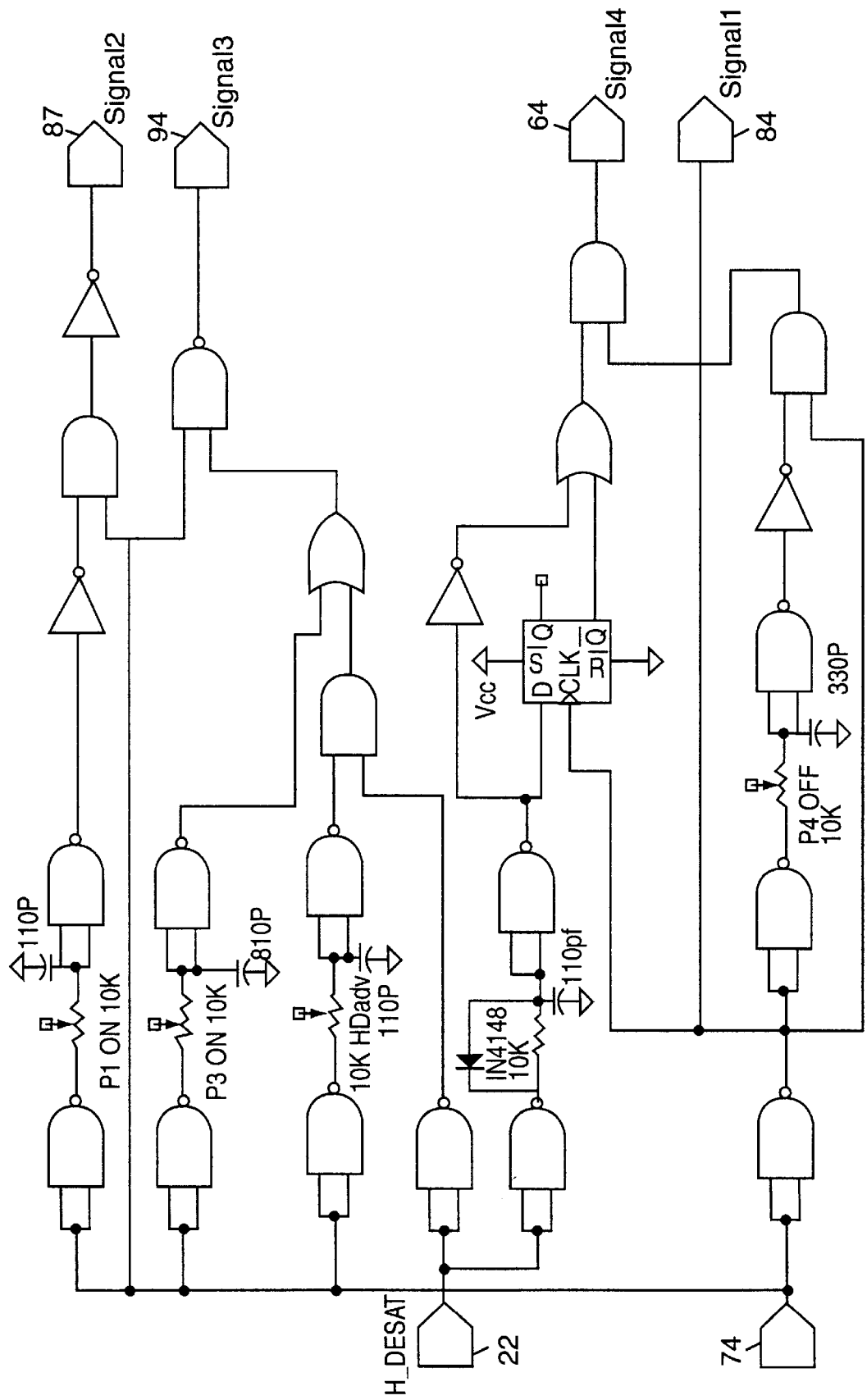
FIG. 9 is a schematic logic diagram for a logic circuit that may be utilized to provide the control signals shown in FIGS. 3–7.

Circuits that may be utilized to provide the control SIGNALS 1, 2, 3 and 4 of FIGS. 3–7 are shown in FIGS. 8 and 9. FIG. 8 is an implementation of the collector voltage detection circuit 25 and includes a voltage divider and scaling circuit 130 which is connected to the power collector 14 and the Kelvin emitter 17 and which provides a scaled output voltage on an output line 131. The scaled output voltage on the line 131 is provided through a zener diode 133 to a transistor 134, the collector of which is connected to the line 22 and provides a signal designated H DESAT. When the collector to emitter voltage between the lines 14 and 17 drops below a selected level, the scaled output of which is provided on the line 131, the voltage across the zener diode 133 exceeds a break-over voltage of the diode, causing the transistor 134 to conduct and changing the signal H DESAT from low to high on the line 22. This corresponds to the HDesat voltage level indicated on FIG. 3. The H DESAT signal on the line 22 and the main gate control signal on the line 74 are provided to the exemplary logic circuit shown in FIG. 9. The advance of the high value 116 of SIGNAL 3 on the line 94 is carried out by the circuit of FIG. 9 by effectively ANDing the H DESAT signal with a time delayed main gate enable signal which is ORed with another time delayed H DESAT signal. Referring to FIG. 3, if the collector to emitter voltage 108 falls below the HDesat level at the proper time as illustrated in FIG. 3, the SIGNAL 3 high signal 116 is provided at the normal time delay from the on-time of the main gating signal. However, if the collector-emitter voltage 108 never reaches the HDesat level because of a fault, as shown in FIG. 6, then the high value 116 of SIGNAL 3 is provided at the initial time $t_{20}$, which is a shorter time delay from the on-time of the gate enable signal than the normal gate delay on-time for the high value 116 of SIGNAL 3 as shown in FIG. 3.

Figure 10:
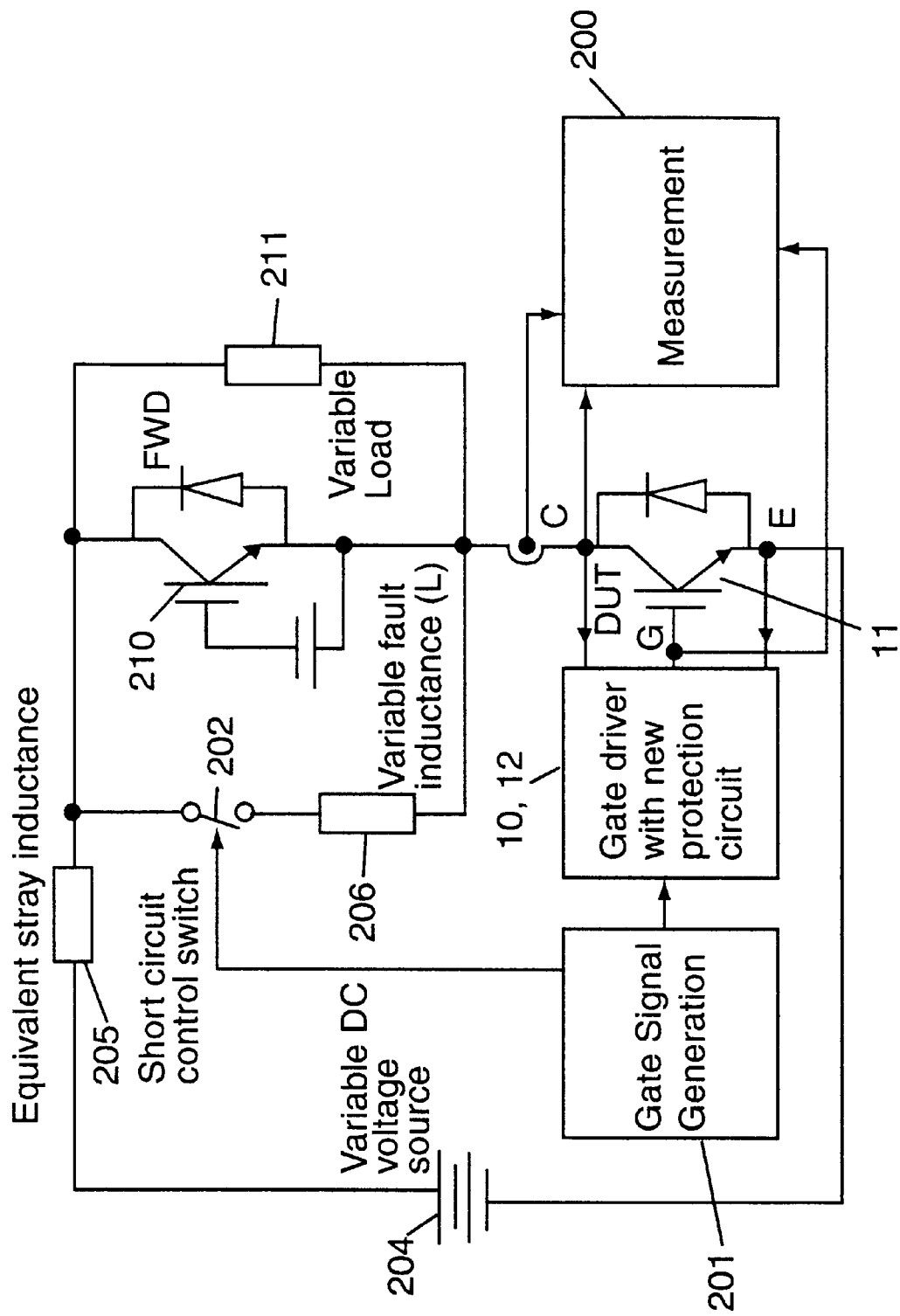
FIG. 10 is a schematic circuit diagram of a test circuit which may be employed for purposes of characterizing the function of the invention.

For purposes of characterizing the functioning of the invention, a test circuit of the type shown in FIG. 10 may be utilized. The test set-up includes a measurement circuit 200 which directly measures the current through the IGBT 11, and a gate signal generation circuit 201 which provides the gate input to the gate driver 12 and the protection circuit 10. The gate signal generation circuit 201 also controls a short circuit control switch 202 which controls the application of voltage from a variable DC voltage source 204 through an equivalent stray inductance 205 and through a variable fault inductance 206. An IGBT 210 and a variable load 211 are connected in parallel around the switch 202 to simulate a load for full-load tests. The gate signal generation circuit 201 provides a two-pulse output with a controlled time duration for the first pulse for obtaining the desired load current, which would be the initial value at turn-on of the second pulse. For testing under full load conditions, the short circuit control switch 202 is turned on while the IGBT 11 is in the on-state and conducting load current during the second pulse. For hard-switched fault testing, the short circuit control switch 202 is already turned on before the second pulse activates the device 11.

Figure 11:
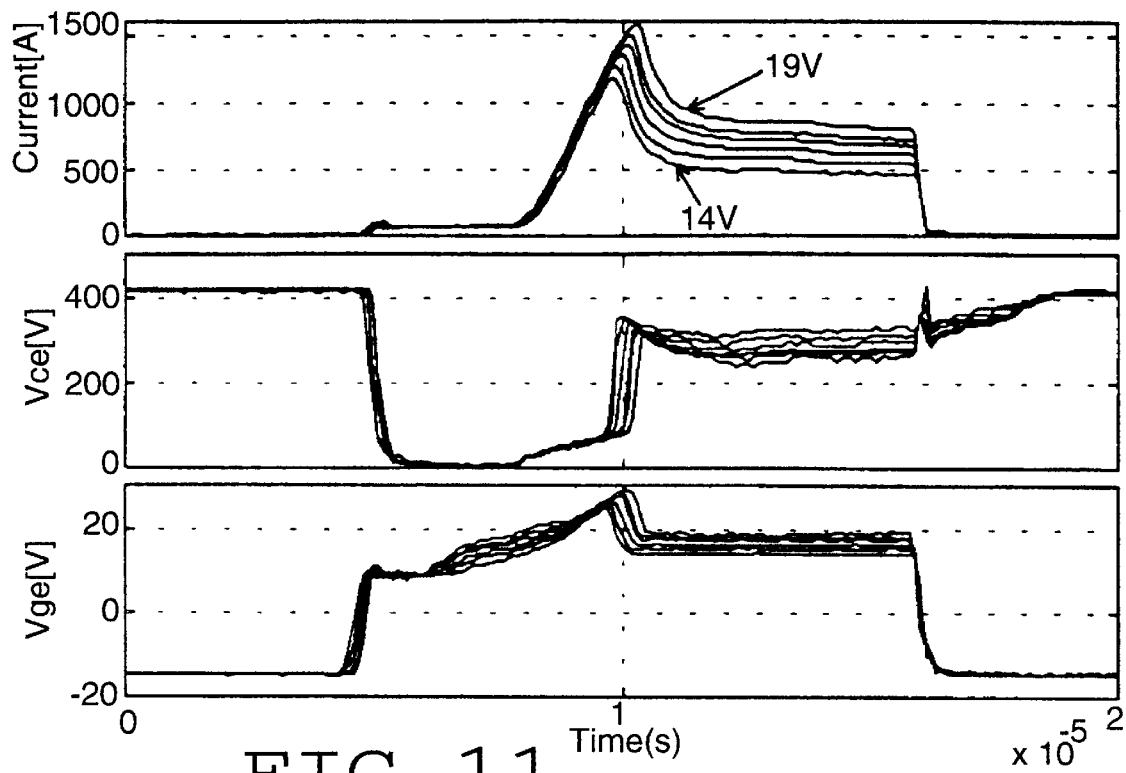
FIG. 11 is a waveform diagram showing measured collector current, collector voltage, and gate voltage waveforms for an IGBT without fault protection during a fault condition under-load.
Figure 12:
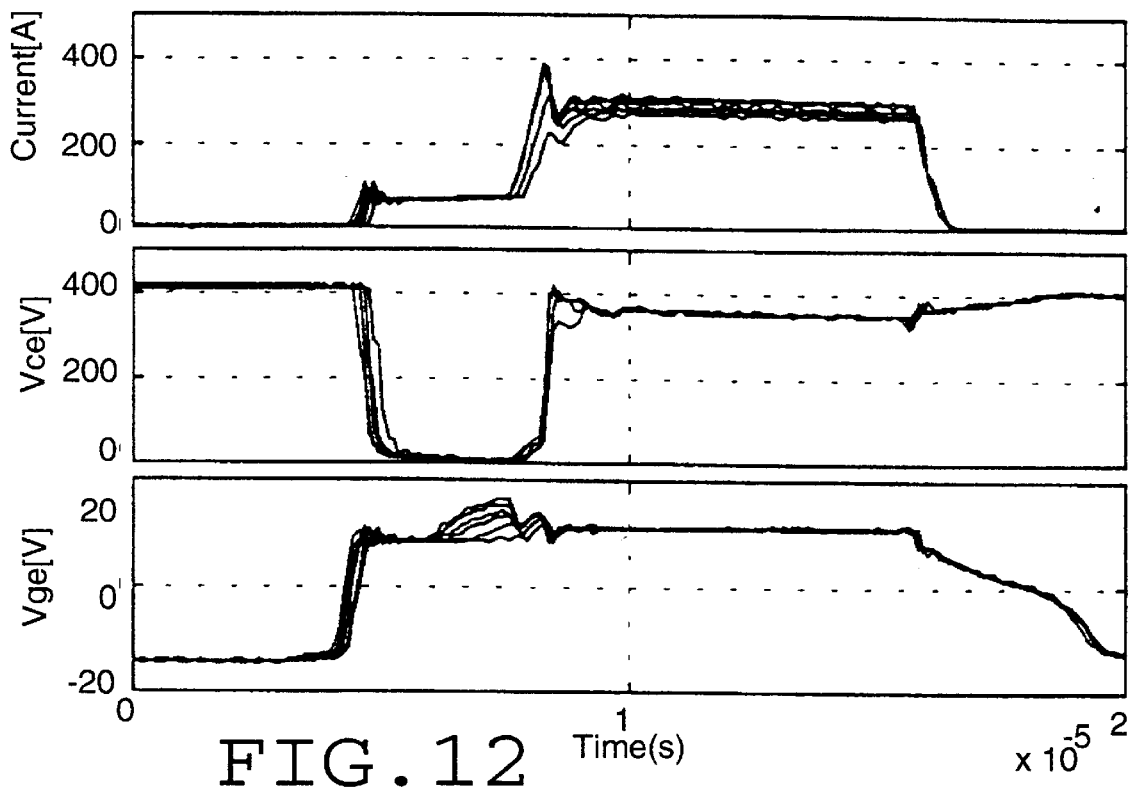
FIG. 12 is a waveform diagram showing collector current, collector voltage, and gate waveforms for an IGBT with a protection circuit in accordance with the present invention for a fault condition under-load.
Figure 13:
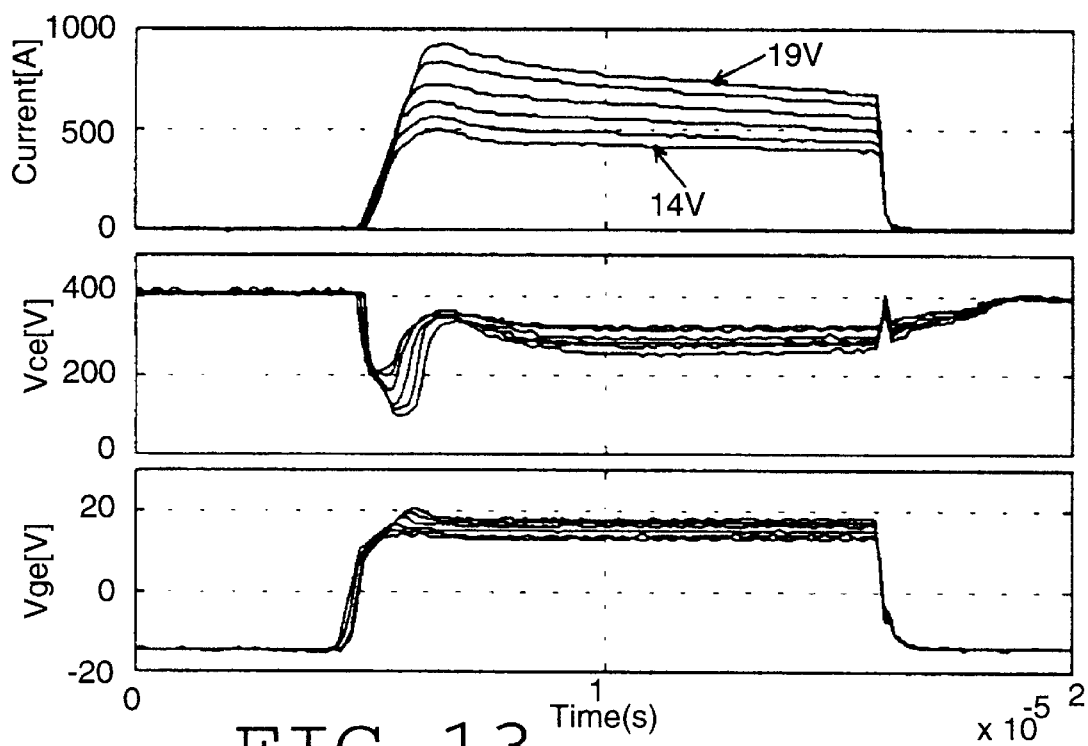
FIG. 13 is a waveform diagram showing measured collector current, collector voltage, and gate voltage waveforms for an IGBT without protection for a hard-switched fault test.
Figure 14:
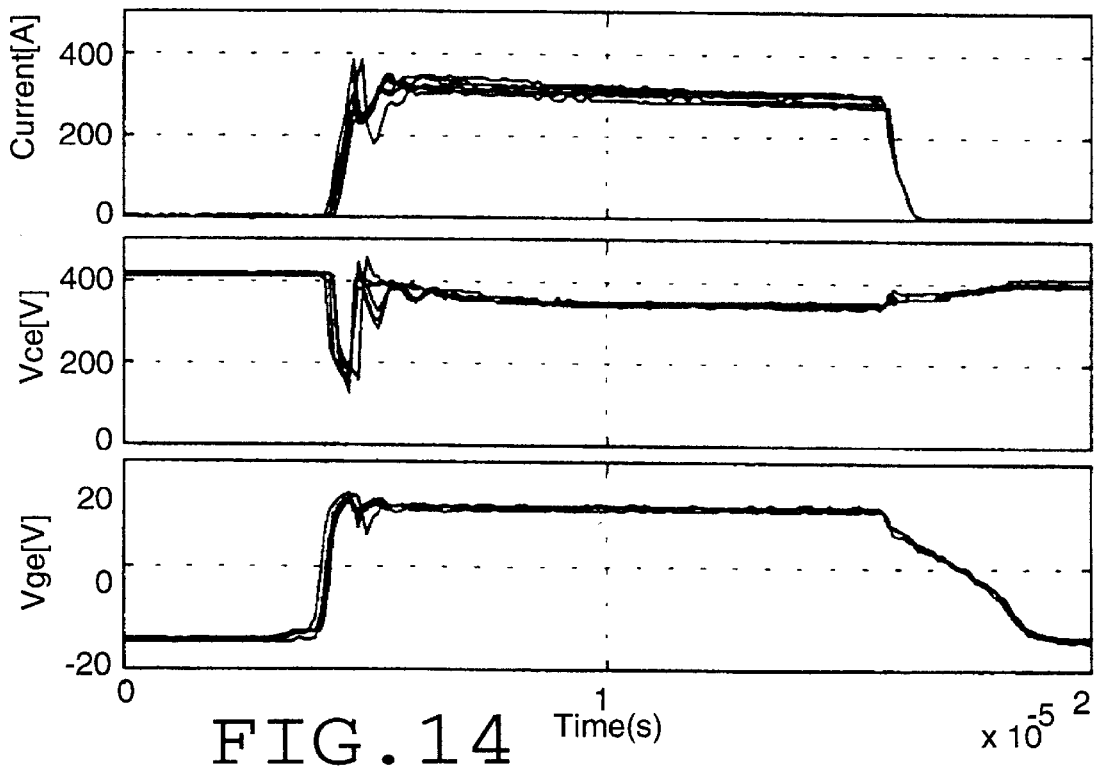
FIG. 14 is a waveform diagram showing measured collector current, collector voltage, and gate voltage waveforms for an IGBT with short circuit fault protection in accordance with the present invention for a hard-switched fault test.

An example of a dual IGBT module tested utilizing the invention is a Toshiba MG100Q2YS40 (1200 V, 100 A). The measured collector current, collector voltage, and gate voltage waveforms for this IGBT during a full load test, are shown without the protection circuit 10 in FIG. 11 and with the protection circuit in FIG. 10. The selected positive gate voltages in each case are 14, 15, 16, 17, 18, and 19 V, with the capacitance of the capacitor 30 equal to 30 nF, the pre-charge voltage of the capacitor 30 equal to 4.5 V, the voltage from the DC source 204 equal to 405 V, at an ambient temperature of 24° C., and with the value of the variable load inductance L equal to 200 nH. FIG. 13 illustrates the waveforms for the hard-switched fault test for this IGBT without protection and FIG. 14 illustrates the hard-switched test results with protection. The selected positive gate voltages were 14, 15, 16, 17, 18, and 19 V. The value of the capacitor 30 was 60 nF, the pre-charge voltage of the capacitor was equal to 5 volts, the DC voltage source 204 was 405 volts, the ambient temperature of the device tested was 24° C,. and the value of the variable fault inductance 206 was 200 nH. It is seen that in the case of no protection in FIG. 11 the peak and final current levels are strongly dependent upon the gate voltages. When the on-state gate voltage is 19 V, the peak current is more than 15 times the rated current. From FIG. 12 it can be seen that the fault currents are at controlled levels without regard to the value of the on-state gate voltage. FIG. 13 illustrates that the peak and final current levels without protection are increased by a factor of two when the gate voltage is increased from 14 V to 19 V. FIG. 14 shows that the fault currents are kept within a small envelope for a wide range of the on-state gate voltages. The foregoing values of capacitance and pre-charge voltage were selected to provide optimal characteristics for the protection circuit. These data show that by utilizing the active protection circuit of the invention, significantly lower fault current levels can be achieved irrespective of the on-state gate voltages, thereby allowing higher gate voltages to be used in normal operation with consequent lower conducting losses in the IGBT.

It is understood that the invention is not confined to the embodiments set forth herein for illustration, but embraces all such forms thereof as come within the scope of the following claims.

What is claimed is:

1. A protection circuit for a high power semiconductor switching device having a gate terminal controlling the current flow between power terminals of the device, comprising:
   (a) means for estimating the current through the device by integrating the voltage across an inductance in the current flow path of the device and providing a first fault signal if the estimated current exceeds a selected value;
   (b) means for monitoring the voltage across the power terminals of the device and providing a second fault signal if the voltage across the terminals when the device is switched on exceeds a selected level; and
   (c) means for limiting the gate terminal to a selected control level intermediate the full-on and full-off current levels of the switching device when either the first or the second fault signals is provided.

2. The protection circuit of claim 1 wherein the means for limiting comprises a paralleled capacitor and zener diode which are connected in series with a transistor between the gate terminal and ground, the control input of the transistor receiving ORed first and second fault signals from the means for estimating and the means for monitoring.

3. The protection circuit of claim 1 wherein the power device is an IGBT having a power collector terminal, a power emitter terminal, and a Kelvin emitter, and wherein the inductance in the current flow path is between the power emitter terminal and the Kelvin emitter terminal, wherein the means for estimating is connected to the Kelvin emitter terminal and the power emitter terminal and includes an integrator connected to integrate the voltage between these terminals and a comparator, the output of the integrator provided to the comparator which provides the first fault signal if the output of the integrator exceeds a selected level.

4. The protection circuit of claim 1 further including a shut down circuit comprising a paralleled zener diode and capacitor, and a transistor switch connected in series with the parallel capacitor and zener diode between the gate terminal and ground, and means for precharging the shut down capacitor to a selected voltage level, the transistor switch operable to be turned on after a fault has been detected and the gate terminal is at a clamped voltage level when the gate drive input to the gate is turned off to provide voltage to the gate terminal from the shut down capacitor which decays gradually over time to the off-gate voltage of the switching device, to thereby gradually turn off the switching device in a soft manner.

5. A protection circuit for an IGBT switching device having a gate terminal, power collector and power emitter terminals, and a Kelvin emitter terminal, comprising:
   (a) a current estimation circuit comprising an integrator connected to integrate the voltage between the power emitter and the Kelvin emitter terminals and a comparator connected to the integrator to compare the integrator output to a selected level and provide a fault signal when the selected level is reached; and
   (b) means for limiting the gate terminal voltage to a selected level intermediate the full-on and full-off current levels of the IGBT switching device when the fault signal is provided.

6. The protection circuit of claim 5 wherein the means for limiting comprises a paralleled capacitor and zener diode which are connected in series with a transistor between the gate terminal and ground, the control input of the transistor receiving the fault signal from the current estimation circuit.

7. The protection circuit of claim 5 further including a shut down circuit comprising a paralleled zener diode and capacitor, and a transistor switch connected in series with the shut down capacitor and zener diode between the gate terminal and ground, and means for precharging the shut down capacitor to a selected voltage level, the transistor switch operable to be turned on after a fault has been detected and the gate terminal is at a clamped voltage level when the gate drive input to the gate is turned off to provide voltage to the gate terminal from the shut down capacitor which decays gradually over time to the off-gate voltage of the switching device, to thereby gradually turn off the switching device in a soft manner.

8. A protection circuit for an IGBT switching device having a gate terminal, power emitter and collector terminals, and a Kelvin emitter terminal, comprising:
   (a) means for providing a fault signal if the current between the power collector and emitter terminals when the device is switched on exceeds a selected level; and
   (b) a paralleled capacitor and zener diode which are connected in series with a transistor between the gate terminal and ground, the control input of the transistor receiving the fault signal from the means for providing a fault signal to turn on the transistor to initially drive the gate voltage down to a low level and then gradually increasing the gate voltage until the break-over voltage of the zener diode is reached.

9. The protection circuit of claim 8 wherein the means for providing a fault signal is connected to the Kelvin emitter terminal and the power emitter terminal and includes an integrator connected to integrate the voltage between these terminals and a comparator, the output of the integrator provided to the comparator which provides the fault signal if the output of the integrator exceeds a selected level.

10. The protection circuit of claim 8 further including a shut down circuit comprising a paralleled zener diode and capacitor, and a transistor switch connected in series with the shut down capacitor and zener diode between the gate terminal and ground, and means for precharging the shut down capacitor to a selected voltage level, the transistor switch operable to be turned on after a fault has been detected and the gate terminal is at a clamped voltage level when the gate drive input to the gate is turned off to provide voltage to the gate terminal from the shut down capacitor which decays gradually over time to the off-gate voltage of the switching device, to thereby gradually turn off the switching device in a soft manner.

11. The protection circuit of claim 8 further including means for pre-charging the capacitor such that when a fault is detected and the transistor is turned on, the gate line initially drops to the pre-charge voltage and then gradually increases as the capacitor is charged.

12. A shut down circuit for an IGBT switching device having a gate terminal and emitter and collector terminals comprising:

a paralleled zener diode and capacitor, and a transistor switch connected in series with the capacitor and zener diode between the gate terminal and ground, and means for precharging the capacitor to a selected voltage level, the transistor switch operable to be turned on after a fault has been detected and the gate terminal is at a clamped voltage level when the gate drive input to the gate is turned off to provide voltage to the gate terminal from the shut down capacitor which decays gradually over time to the off-gate voltage of the switching device, to thereby gradually turn off the switching device in a soft manner.

13. The shut down circuit of claim 12 wherein the means for precharging the capacitor charges the capacitor to a voltage level such that when the transistor is turned on the capacitor will initially apply a voltage to the gate terminal that is at the normal on-gate voltage level.

14. A method of short circuit protecting high power semiconductor switching devices of the type having a gate terminal controlling the current flow between power terminals of the device, comprising the steps of:

(a) estimating the current flowing through the device by integrating the voltage across an inductance in the current flow path of the device and providing a first fault signal if the estimated current exceeds a selected value;

(b) monitoring the voltage across the power terminals of the device and providing a second fault signal if the voltage across the terminals when the device is switched on exceeds a selected level; and (c) limiting the gate terminal to a selected control level which is intermediate the full-on and full-off current levels of the switching device when either the first or second fault signals is present.

15. The method of claim 14 wherein the step of limiting the gate terminal to a selected control level includes connecting between the gate terminal and ground a paralleled capacitor and zener diode such that the voltage on the gate terminal is initially diverted through the capacitor to drop the gate terminal voltage to a low level which builds gradually up to the break-over level of the zener diode which defines the control level of the gate terminal.

16. A method of short circuit protecting an IGBT switching device of the type having a gate terminal, power collector and power emitter terminals, and a Kelvin emitter terminal, comprising the steps of:

(a) integrating the voltage between the power emitter and the Kelvin emitter terminals when the IGBT switching device is turned on to provide an integrated value comparing the integrated value to a selected level, and providing a fault signal when the selected level is reached; and (b) limiting the gate terminal voltage to a selected level intermediate the full-on and full-off current levels of the IGBT switching device when the fault signal is provided.

17. The method of claim 16 wherein the step of limiting the gate terminal voltage includes connecting between the gate terminal and ground a paralleled capacitor and zener diode such that the voltage on the gate terminal is initially conducted through the capacitor to drop the gate voltage to a low level which gradually builds up as the capacitor is charged until the zener break-over voltage is reached, which defines the selected level intermediate the full-on and full-off current levels of the IGBT.

18. A method of shutting down an IGBT switching device after a fault, the IGBT switching device having a gate terminal and emitter and collector terminals, comprising the steps of:

(a) detecting a short circuit fault and limiting the voltage level of the gate terminal to a selected level intermediate the full-on and full-off current levels of the IGBT switching device and maintaining that gate voltage for a selected period of time; and (b) connecting between the gate terminal and ground a paralleled capacitor and zener diode, the capacitor precharged to a selected voltage level, to apply the precharged voltage level from the capacitor to the gate terminal while switching the main gate drive signal to the gate terminal from the on state to the off state to provide voltage to the gate terminal from the capacitor which decays gradually over time to the off-gate voltage of the switching device to thereby gradually turn off the switching device in a soft manner.

19. The method of claim of 18 wherein the capacitor is precharged to a voltage level such that when the capacitor is connected between the gate terminal and ground the capacitor will initially apply a voltage to the gate terminal that is at the normal on-gate voltage level.

* * * * *